United States Patent
Yu et al.

(10) Patent No.: US 8,294,201 B2
(45) Date of Patent: Oct. 23, 2012

(54) HIGH-K GATE DIELECTRIC AND METHOD OF MANUFACTURE

(75) Inventors: Chen-Hua Yu, Hsin-Chu (TW); Liang-Gi Yao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/209,493

(22) Filed: Aug. 15, 2011

(65) Prior Publication Data

US 2011/0291205 A1    Dec. 1, 2011

Related U.S. Application Data

(63) Continuation of application No. 11/835,263, filed on Aug. 7, 2007, now Pat. No. 7,998,820.

(51) Int. Cl.
*H01L 29/792* (2006.01)

(52) U.S. Cl. .............................. 257/324; 257/E29.309

(58) Field of Classification Search .................. 257/324, 257/E29.309
See application file for complete search history.

(56) References Cited

U.S. PATENT DOCUMENTS

| | | | |
|---|---|---|---|
| 5,298,447 A | 3/1994 | Hong | |
| 6,110,784 A | 8/2000 | Gardner et al. | |
| 6,380,104 B1 | 4/2002 | Yu | |
| 6,407,435 B1 | 6/2002 | Ma et al. | |
| 6,432,776 B1 | 8/2002 | Ono | |
| 6,444,592 B1 | 9/2002 | Ballantine et al. | |
| 6,511,876 B2 | 1/2003 | Buchanan et al. | |
| 6,689,675 B1 | 2/2004 | Parker et al. | |
| 6,703,780 B2 | 3/2004 | Shiang et al. | |
| 6,716,695 B1 | 4/2004 | Hattangady et al. | |
| 6,727,134 B1 | 4/2004 | Chen et al. | |
| 6,737,362 B1 | 5/2004 | Chen et al. | |
| 6,750,126 B1 | 6/2004 | Visokay et al. | |
| 6,770,923 B2 | 8/2004 | Nguyen et al. | |
| 6,790,755 B2 | 9/2004 | Jeon | |
| 6,797,644 B2 | 9/2004 | Watt et al. | |
| 6,809,370 B1 | 10/2004 | Colombo et al. | |
| 6,875,678 B2 | 4/2005 | Jung et al. | |
| 6,894,369 B2 | 5/2005 | Irino et al. | |
| 6,897,095 B1 | 5/2005 | Adetutu et al. | |
| 6,933,225 B2 | 8/2005 | Werkhoven et al. | |
| 6,974,764 B2 | 12/2005 | Brask et al. | |
| 7,030,024 B2 | 4/2006 | Ho et al. | |
| 7,037,845 B2 | 5/2006 | Brask et al. | |
| 7,074,680 B2 | 7/2006 | Doczy et al. | |
| 7,101,753 B2 | 9/2006 | Kamiyama et al. | |
| 7,129,563 B2 | 10/2006 | Cosnier et al. | |
| 7,138,692 B2 | 11/2006 | Tamura et al. | |
| 7,344,934 B2 | 3/2008 | Li | |

(Continued)

OTHER PUBLICATIONS

Chinese Patent Office, Office Action dated Jul. 3, 2009, Application No. 200710193991X, 3 pages.

(Continued)

*Primary Examiner* — William D Coleman

(74) *Attorney, Agent, or Firm* — Haynes and Boone, LLP

(57) ABSTRACT

A device and method of formation are provided for a high-k gate dielectric and gate electrode. The high-k dielectric material is formed, and a silicon-rich film is formed over the high-k dielectric material. The silicon-rich film is then treated through either oxidation or nitridation to reduce the Fermi-level pinning that results from both the bonding of the high-k material to the subsequent gate conductor and also from a lack of oxygen along the interface of the high-k dielectric material and the gate conductor. A conductive material is then formed over the film through a controlled process to create the gate conductor.

20 Claims, 4 Drawing Sheets

U.S. PATENT DOCUMENTS

| | | |
|---|---|---|
| 2002/0137250 A1 | 9/2002 | Nguyen et al. |
| 2003/0032281 A1 | 2/2003 | Werkhoven et al. |
| 2005/0101147 A1 | 5/2005 | Labelle et al. |
| 2007/0176242 A1 | 8/2007 | Lee et al. |
| 2008/0001237 A1 | 1/2008 | Chang et al. |

OTHER PUBLICATIONS

Chang, V.S., et al., "Modeling and Engineering of Hafnium Silicate (HfSiO) Gate Dielectric Deposited by Nano-Laminated Atomic Layer Deposition (NL-ALD)," vol. 1 (2006), in press, ECS Transaction, 11 pages.

Choi, C., et al., "The Effects of nitrogen and Silicon Profile on High-K MOSFET Performance and Bias temperature Instability," Symposium on VLSI Technology Digest of Technical Papers (2004), pp. 214-215.

Hou, Y.T., et al., "High Performance Tantalum Carbide Metal Gate Stacks for nMOSFET Application," IEEE (2005), 4 pages.

Kimizuka, N., et al., "NBTI Enhancement by Nitrogen Incorporation into Ultrathin Gate Oxide for 0.10-μm Gate CMOS Generation," Symposium on VLSI technology Digest of Technical papers (2000), pp. 92-93.

Sekine, K., et al., "Nitrogen Profile control by Plasma Nitridation Technique for Poly-Si Gate HsSiON CMOSFEET with Excellent Interface property and Ultra-Low Leakage Current," IEDM (2003), pp. 103-106.

Tamura, Y., et al., "SiN-Capped HfSiON Gate Stacks with Improved Bias Temperature instabilities for 65 nm-node Low-Standby-Power Transistors," Symposium on VLSI Technology Digest of Technical papers (2004), pp. 210-211.

HIGH-K GATE DIELECTRIC AND METHOD OF MANUFACTURE

PRIORITY DATA

This Continuation application claims priority to application Ser. No. 11/835,263, filed on Aug. 7, 2007, entitled "HIGH-K GATE DIELECTRIC AND METHOD OF MANUFACTURE," the entire disclosure of which is incorporated herein by reference.

TECHNICAL FIELD

The present invention relates generally to a system and method of forming a high-k material, and more particularly to a system and method for forming a high-k gate dielectric in a metal-oxide semiconductor field-effect transistor.

BACKGROUND

With the scaling of integrated circuits, applications require an increasingly faster speed. This puts a requirement on the metal-oxide-semiconductor (MOS) devices, demanding that the MOS devices switch faster. As is known in the art, to increase the speed of MOS devices, high dielectric constant values (k values) of the gate dielectrics are desired. Since conventional silicon oxide, which has a k value of about 3.9, cannot satisfy such a requirement, high-k dielectric materials, which include oxides, nitrides, and oxynitrides, are increasingly used.

Such a MOS device 100 is illustrated in FIG. 1, which has a substrate 101 with isolation regions 103, a gate dielectric 105, a gate electrode 107, source/drain regions 109, and spacers 111. In this device 100 the gate dielectric 105 is formed from a high-k dielectric material in order to increase the switching speed of the device.

However, when the gate electrode 107 is formed directly over the high-k material in the gate dielectric 105, an effect known as Fermi-level pinning occurs which can reduce the switching speed of the device 100. This "pinning" of the Fermi layer along the interface of the gate dielectric 105 and the gate electrode 107 is the result of two causes. The first cause is dangling bonds (broken covalent bonds) along the edge of the high-k material that will bond with the deposited gate electrode and form a "pinned" interface state. The second cause is a lack of oxygen bonds along the interface and the high-k material. Both of these causes have an effect on the Fermi-level pinning of the interface, thereby decreasing the efficiency of the device as a whole.

Accordingly, what is needed is a device and method of formation to either reduce the dangling bonds of the high-k material or increase the amount of oxygen along the interface.

SUMMARY OF THE INVENTION

These and other problems are generally solved or circumvented, and technical advantages are generally achieved, by preferred embodiments of the present invention which reduce the dangling bonds of the high-k material that are available to bond with the subsequent conductive material, and also increase the amount of oxygen along the interface of the high-k dielectric material and the gate electrode.

In accordance with a preferred embodiment of the present invention, a semiconductor device comprises a substrate with a high-k dielectric material over the substrate. Over the high-k dielectric material, an oxidized silicon-rich film is located, and a conductive material is located over the silicon-rich film.

In accordance with another preferred embodiment of the present invention, a semiconductor device comprises a substrate and a high-k dielectric material over the substrate. On the high-k dielectric material, a film comprising silicon and nitrogen is located, and a conductive layer is located over the film.

In accordance with yet another preferred embodiment of the present invention, a transistor is formed with a substrate, a gate stack on the substrate, source/drain regions in the substrate on opposing sides of the gate stack, and spacers formed on the sidewalls of the gate stack. The gate stack comprises a layer of high-k material over the substrate, a film of material that comprises silicon and either nitrogen or oxygen, and a conductive layer over the film.

An advantage of a preferred embodiment of the present invention is reduced or eliminated Fermi-level pinning at the interface of the high-k dielectric and the gate electrode.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a gate dielectric in a metal-oxide semiconductor field effect transistor. The invention may also be applied, however, to other devices that benefit from a high-k dielectric material.

Figure 1:
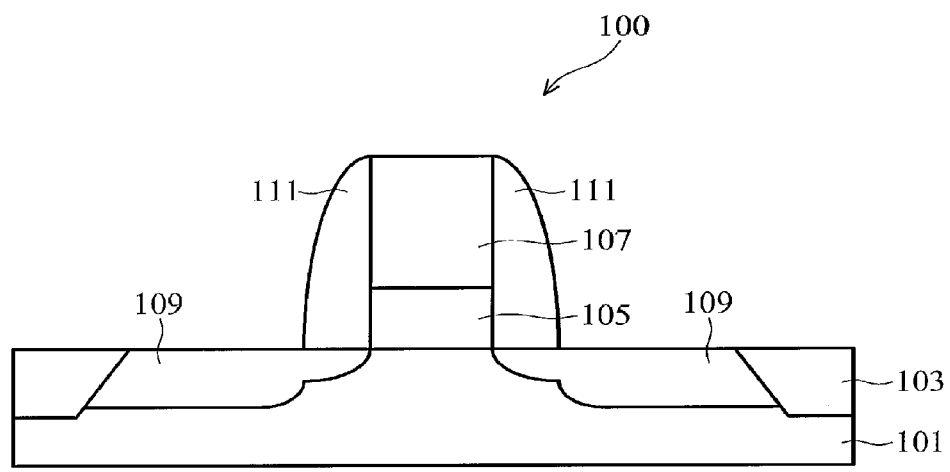
FIG. 1 illustrates a transistor as is known in the prior art.
Figure 2:
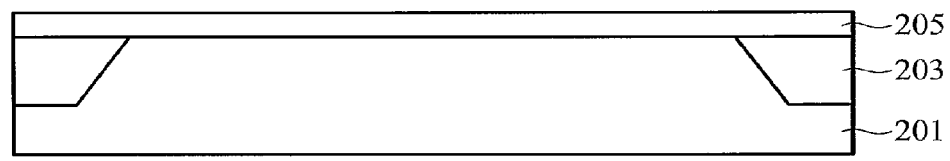
FIGS. 2-8 illustrate steps in the process of forming a high-k gate dielectric in accordance with an embodiment of the present invention.

With reference now to FIG. 2, there is shown a substrate 201 with shallow trench isolations (STIs) 203 formed therein. The substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The STIs 203 are generally formed by etching the substrate 201 to form a trench and filling the trench with a dielectric material as is known in the art. Preferably, the STIs 203 are filled with a dielectric material such as an oxide material, a high-density plasma (HDP) oxide, or the like, formed by conventional methods known in the art.

A base oxide layer 205 may be formed over the substrate 201. In the preferred embodiment, base oxide layer 205 is formed by submerging substrate 201 into a solution, which contains de-ionized water and ozone ($O_3$). Such a solution is often denoted as $DiO_3$. The $DiO_3$ solution is preferably ultra-diluted, containing $O_3$ of between about 1 part per million (ppm) and about 100 ppm, and more preferably between about 1 ppm and about 10 ppm. The oxidation is preferably performed at room temperature, for example, about 25.degree. C., although higher or lower temperatures can be used. The preferred process time is about 10 seconds to about 30 seconds. However, alternative methods of formation, such as subjecting the silicon-rich film 401 to an oxidizing environment such as steam or oxygen-containing ambient at a room temperature of about 600.degree. C. to about 1,100.degree. C., could alternatively be utilized.

Base oxide layer 205 preferably has a thickness of less than about 10 Angstroms, and more preferably between about 5 Angstroms to about 7 Angstroms. The thickness of the base oxide layer 205 can be controlled by adjusting the process conditions such as time, temperature, etc. As is commonly perceived, given a process time, the thickness of the base oxide layer 205 may be affected by the process temperature. A low temperature tends to cause slower oxide formation, but the oxide thickness tends to be thin. The optimal process temperature and process time may be determined by routine experiments.

Figure 3:
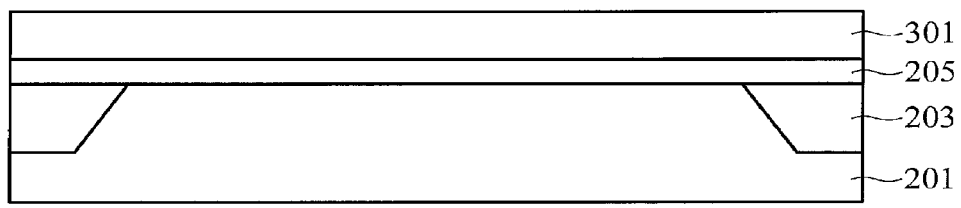
Figure 5:
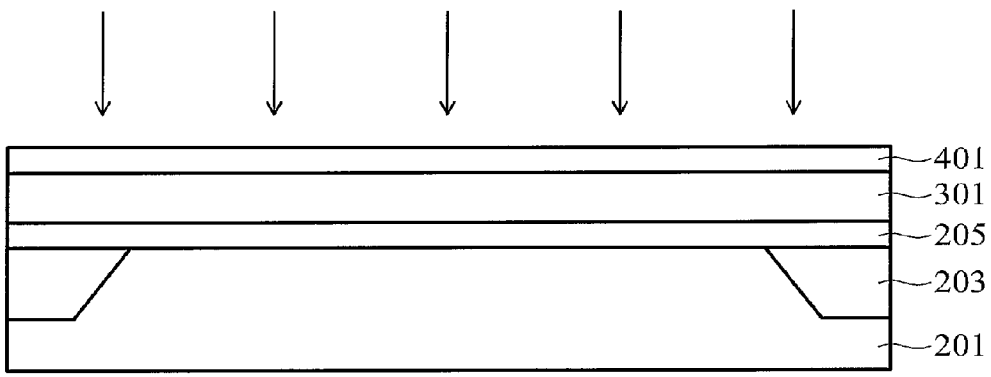

FIG. 3 illustrates the formation of a high-k dielectric layer 301 on the base oxide layer 205, as is shown in FIG. 5. In the preferred embodiment, the high-k dielectric layer 301 includes hafnium oxide ($HfO_2$) or else a silicate oxide such as $HfSiO_X$. In alternative embodiments, the high-k dielectric layer 301 includes other hafnium-containing materials such as $HfZrO_X$, $HfAlO_X$, $HfLaO_X$, $HfO_2$, $HfTiO_X$, $HfTaO_X$, $HfTiTaO_X$, and combinations thereof. In yet other embodiments, high-k dielectric layer 301 includes metal oxides such as $LaO_3$, $ZrO_2$, $Al_2O_3$, $Ta_2O_5$, $TiO_2$, and combinations thereof. Preferably, the k value of the high-k dielectric layer 301 is greater than about 7. Conventionally, the high-k dielectric layer 301 preferably has a thickness of at least 30 Angstroms. Otherwise, the leakage current through the high-k dielectric layer 301 may be significant. In the preferred embodiment, however, with higher quality and a more amorphous structure, the thickness of the high-k dielectric layer 301 can be 30 Angstroms or less, or even 20 Angstroms or less, without causing a significant leakage current. It should be appreciated that the high-k dielectric layer 301 may also have a thickness of greater than about 20 Angstroms, or even about 30 Angstroms or more.

The preferred formation method of high-k dielectric layer 301 is atomic layer deposition (ALD). However, other commonly used methods such as plasma enhanced chemical vapor deposition (PECVD), low-pressure chemical vapor deposition (LPCVD), metal-organic chemical vapor deposition (MOCVD), plasma enhanced atomic layer deposition (PEALD), and the like, can also be used. High-k dielectric layer 301 is preferably formed at a low temperature, for example, lower than about 500.degree. C., and more preferably lower than about 350.degree. C., and even more preferably lower than about 250.degree. C. The low temperature will prevent the re-growth of the interfacial oxide layer between substrate 201 and the overlying base oxide layer 205, particularly when oxygen is preserved during the formation of high-k dielectric layer 301.

Figure 4:
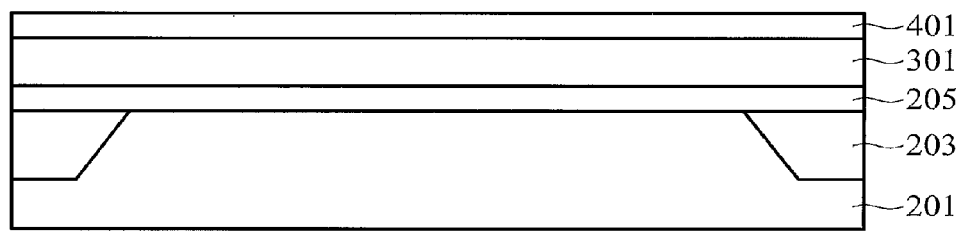

FIG. 4 illustrates the formation of a silicon-rich film 401 on the high-k dielectric layer 301. The silicon-rich film 401 is preferably formed in the same manner as the high-k dielectric layer 301, for example, ALD and the like, as described above with reference to FIG. 3. However, precursors for the formation of silicon would be used instead of precursors for the high-k dielectric layer 301. In an embodiment in which a silicate oxide is being formed as the high-k dielectric layer 301, the silicon-rich film 401 is preferably formed as the last step in the formation of the high-k dielectric layer 301 by reducing the precursors used in the ALD of the high-k dielectric layer 301 until only the silicon precursors are present to deposit the silicon-rich film 401 onto the high-k dielectric layer 301.

In an embodiment in which a metal oxide is used to form the high-k dielectric layer 301, the formation of the high-k dielectric layer 301 is completed prior to the formation of the silicon-rich film 401. The silicon-rich film 401 is then preferably formed through a separate process such as ALD with silicon precursors. However, when a metal oxide is used as the high-k material for the high-k dielectric layer 301, part of the silicon that is deposited immediately adjacent to the metal oxide high-k dielectric layer 301 will react with an upper portion of the metal oxide high-k dielectric layer 301 to form a metal oxide silicate (not shown) between the high-k dielectric layer 301 and the silicon-rich film 401.

FIG. 5 illustrates the oxidation of the silicon-rich film 401. By oxidizing the silicon-rich film 401 after its formation, the material in the high-k dielectric material (either metal oxide or silicate oxide) will react and bond to the oxygen and will not bond to the subsequently deposited gate electrode (discussed below with reference to FIG. 6). This bonding reduces the Fermi-level pinning that would otherwise occur at this interface if the silicon-rich film 401 is not formed.

The silicon-rich film 401 may be oxidized in a similar manner as the substrate 201 was oxidized to form the base oxide layer 205 as referenced above with respect to FIG. 2. In other words, the silicon-rich film 401 may be either chemically or thermally oxidized. Preferably, the oxidation of the silicon-rich film 401 is continued until the silicon-rich film 401 is completely oxidized.

In an embodiment in which the high-k dielectric layer 301 is a silicate oxide, the oxidation of the silicon-rich film 401 will result in a bonding structure downward from the oxidized silicon-rich film 401 to the high-k dielectric layer 301 that will substantially be Si—Si—O—Si—O—Si($M_X$)—Si($M_X$), where Si($M_X$) is the silicate oxide. In an embodiment in which the high-k dielectric layer 301 is a metal oxide, the oxidation of the silicon-rich film 401 will result in a bonding structure downward from the oxidized silicon-rich film 401 to the high-k dielectric layer 301 that will substantially be Si—Si—O—Si—O—Si($M_X$)-$M_X$, where $M_X$ is the metal oxide high-k dielectric material and Si($M_X$) is the metal oxide silicate formed on the surface of the high-k dielectric layer 301.

Alternatively to oxidation, a nitridation of the silicon-rich film 401 could be utilized to bond to the material of the high-k dielectric layer 301 and prevent the high-k material from bonding to the gate electrode material. Preferably, the nitridation of the silicon-rich film 401 may be performed by exposing the silicon-rich film 401 to an ammonia-containing environment at about 600.degree. C. to about 900.degree. C. and about 500 Pa to about 8,000 Pa. Other methods, such as exposing the silicon-rich film 401 to a nitrogen-containing plasma environment at a temperature of about 20.degree. C. to about 100.degree. C., a pressure of about 1 Pa to about 10 Pa, and an exciting frequency of about 13.56 MHz and about 100 to about 1,000 W, could alternatively be used. Preferably, the nitridation of the silicon-rich film 401 is continued until the silicon-rich film 401 is fully nitrided without any dangling bond.

In an embodiment in which the high-k dielectric layer 301 is a silicate oxide and nitridation is performed, the nitridation of the entire silicon-rich film 401 will result in a bonding structure downward from the nitridized silicon-rich film 401 to the high-k dielectric layer 301 that will substantially be Si—Si—N—Si—O(N)—Si($M_X$)—Si($M_X$), where Si($M_X$) is the silicate oxide material of the high-k dielectric layer 301 and the O(N) is an oxynitride. In an embodiment in which the high-k dielectric layer 301 is a metal oxide, the nitridation of the entire silicon-rich film 401 will result in a bonding structure downward from the nitridized silicon-rich film 401 to the high-k dielectric layer 301 that will substantially be Si—Si—N—Si—O(N)—Si($M_X$)-M, where Si($M_X$) is the metal silicate oxide formed on the surface of the high-k dielectric layer 301, M is the metal oxide material of the high-k dielectric layer 301, and O(N) is an oxynitride.

The deposition and subsequent treatment of the silicon-rich film 401 reduces the number of dangling bonds that are located along the surface of the high-k dielectric layer 301. With the reduction of these dangling bonds, fewer atoms of the high-k material layer 401 will react and bond with the material of the gate electrode, thereby reducing the Fermi-level pinning that would occur absent the treated silicon-rich film 401. Further, with the oxidation of the treated silicon-rich film 401, there will be a reduced shortage of oxygen bonds at the interface, thereby further reducing the amount of Fermi-level pinning.

Figure 6:
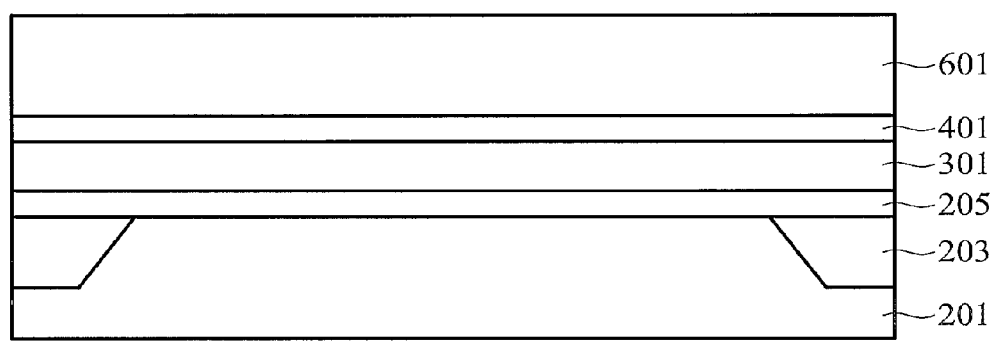

FIG. 6 illustrates the formation of a gate electrode layer 601 on the silicon-rich layer 401. The gate electrode layer 601 preferably comprises a conductive material, such as polysilicon, a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. The gate electrode layer 601 is preferably formed to have a thickness in the range of about 100 Angstroms to about 2,500 Angstroms, but more preferably about 600 Angstroms.

The process used to form the gate electrode layer 601 is preferably controlled so that the oxygen-high-k material bonds (if the silicon-rich layer 401 was oxidized) or the nitrogen-high-k material bonds (if the silicon-rich layer 401 was nitridized) are not broken. If these bonds are broken during the formation of the gate electrode layer 601, the high-k material could then bond with atoms from the gate electrode layer 601, thereby creating the very Fermi-level pinning that is to be avoided.

As such, the gate electrode layer 601 is preferably polysilicon formed through physical vapor deposition (PVD). PVD is preferred because the harsh reducing environments that are required by some of the other methods of formation may actively break the bonds that were formed during the nitridation or oxidation processes, leaving the material in the high-k dielectric layer 401 free to bond with the deposited gate electrode layer 601, which is to be avoided. PVD, without as harsh a reducing atmosphere, will not substantially break these bonds, the preferred bonding structures as laid out above with respect to FIG. 5 will remain intact, and the gate electrode layer 601 will be formed on the silicon rich film 401.

However, while preferred, PVD is not the only method that may be used to form the gate electrode layer 601 and still retain some of the beneficial properties of the present invention. Other methods, such as CVD or LPCVD, could alternatively be used if the process parameters are chosen so as not to remove all of the oxygen or nitrogen that is bonded to the material in the high-k dielectric layer 301. For example, during CVD the process temperature should remain below about 580.degree. C. in order to avoid breaking the bonds.

If these other processes are performed in a reducing atmosphere that includes such precursors as elemental hydrogen ($H_2$), then some of the nitrogen or oxygen atoms that are bonded between the silicon-rich film 401 and the material of the high-k dielectric layer 301 may be removed. However, there will still be some beneficial effects as long as the process conditions do not remove all of the nitrogen or oxygen and also do not break the metal silicate bonds, if present, in the material of the high-k dielectric layer 301.

In an embodiment in which the high-k dielectric layer 301 is a silicate oxide, the silicon-rich layer 401 has been oxidized, and the gate electrode layer 601 is formed through a controlled process involving a reducing atmosphere, the final bonding structure downward from the oxidized silicon-rich film 401 to the high-k dielectric layer 301 will substantially be Si—Si—O—Si—Si($M_X$)—Si($M_X$), where Si($M_X$) is the silicate oxide. In an embodiment in which the high-k dielectric layer 301 is a metal oxide, the silicon-rich layer 401 has been oxidized, and the gate electrode layer 601 is formed through a controlled process involving a reducing atmosphere, the final bonding structure downward from the oxidized silicon-rich film 401 to the high-k dielectric layer 301 will substantially be Si—Si—O—Si—Si($M_X$)-$M_X$, where $M_X$ is the metal oxide and Si($M_X$) is the metal oxide silicate formed on the surface of the high-k dielectric layer 301.

In an embodiment in which the high-k dielectric layer 301 is a silicate oxide, the silicon-rich layer 401 has been nitridized, and a controlled process with a reducing atmosphere is used to form the gate electrode layer 601, the final bonding structure downward from the silicon-rich film 401 to the high-k dielectric layer 301 may substantially be Si—Si—N—Si—Si($M_X$)—Si($M_X$), where Si($M_X$) is the silicate oxide material of the high-k dielectric layer 301. In an embodiment in which the high-k dielectric layer 301 is a metal oxide, the silicon-rich film 401 is nitridized, and a controlled process with a reducing atmosphere is used to form the gate electrode layer 601, the final bonding structure downward from the nitridized silicon-rich film 401 to the high-k dielectric layer 301 will substantially be Si—Si—N—Si—Si($M_X$)-$M_X$, where Si($M_X$) is the metal silicate oxide formed on the surface of the high-k dielectric layer 301 and M is the metal oxide material of the high-k dielectric layer 301.

Figure 7:
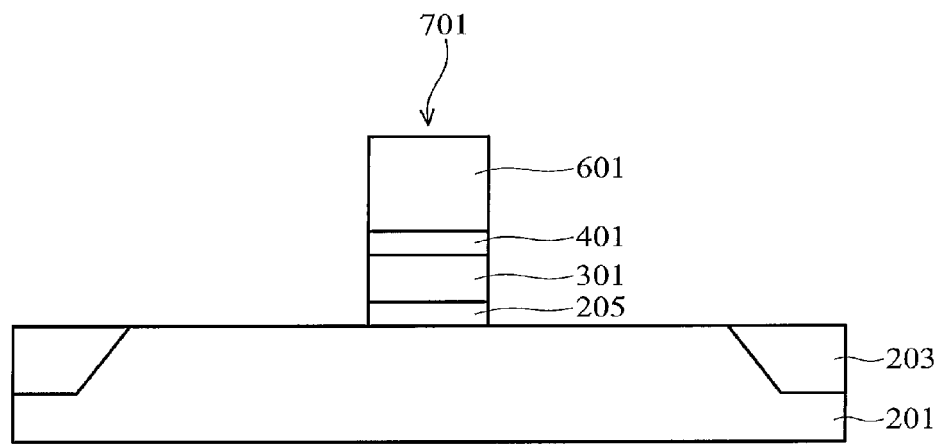

FIG. 7 illustrates the formation of a gate stack 701 from the gate electrode layer 601, the silicon-rich film 401, the high-k dielectric layer 301, and the base oxide layer 205. The gate stack 701 is preferably formed by the deposition and patterning of a photoresist layer (not shown) over the gate electrode layer 601. The material not covered by the patterned photoresist layer is then removed through a process such as an etch until the substrate 201 is substantially exposed.

Figure 8:
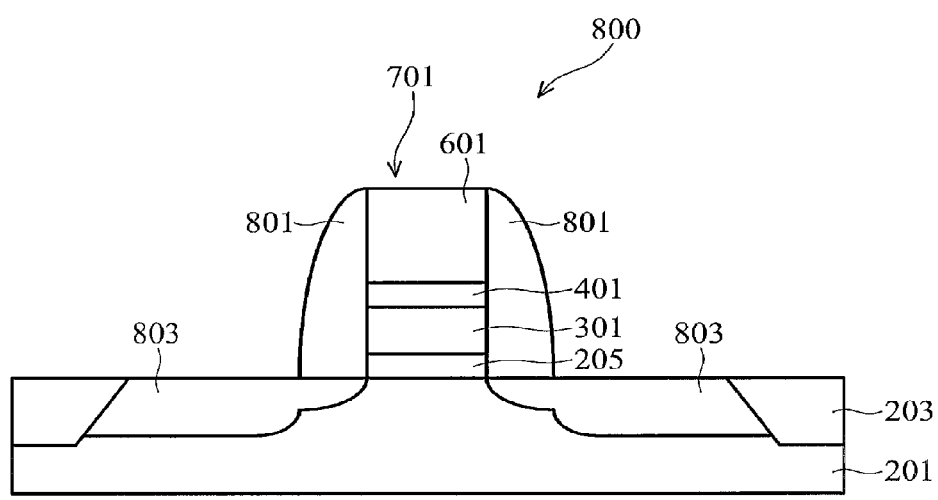

FIG. 8 illustrates the formation of spacers 801 and source/drain regions 803 in order to complete the formation of the device 800. The spacers 801 are formed on the sidewalls of the gate stack 701. The spacers 801 are typically formed by blanket depositing a spacer layer (not shown) on the previously formed structure. The spacer layer preferably comprises SiN, oxynitride, SiC, SiON, oxide, and the like, and is preferably formed by commonly used methods such as chemical vapor deposition (CVD), plasma enhanced CVD, sputter, and other methods known in the art. The spacer layer is then patterned to form the spacers 801, preferably by anisotropically etching to remove the spacer layer from the horizontal surfaces of the structure.

Source/drain regions 803 are formed in the substrate 201 on opposing sides of the gate stack 701. In an embodiment in which the substrate is an n-type substrate, the source/drain regions 803 are preferably formed by implanting appropriate p-type dopants such as boron, gallium, indium, or the like. These source/drain regions 803 are implanted using the gate stack 701 and the gate spacers 801 as masks.

It should be noted that one of ordinary skill in the art will realize that many other processes, steps, or the like may be used to form these source/drain regions 803. For example, one of ordinary skill in the art will realize that a plurality of implants may be performed using various combinations of spacers and liners to form source/drain regions having a specific shape or characteristic suitable for a particular purpose. Any of these processes may be used to form the source/drain regions 803, and the above description is not meant to limit the present invention to the steps presented above.

Although the present invention and its advantages have been described in detail, it should be understood that various changes, substitutions and alterations can be made herein without departing from the spirit and scope of the invention as defined by the appended claims. For example, there are multiple methods for the deposition of some of the materials as the structure is being formed. Any of these deposition methods that achieve substantially the same result as the corresponding embodiments described herein may be utilized according to the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a substrate;
   an oxide layer disposed over the substrate;
   a high-k dielectric layer disposed over the oxide layer;
   a silicon-rich semiconductor film disposed over the high-k dielectric layer, wherein the silicon-rich semiconductor film contains impurities that bond to the high-k dielectric layer; and
   a conductive layer disposed over the silicon-rich semiconductor film.

2. The semiconductor device of claim 1, wherein the silicon-rich semiconductor film is oxidized, and wherein the impurities include oxygen.

3. The semiconductor device of claim 1, wherein the silicon-rich semiconductor film is nitrided, and wherein the impurities include nitrogen.

4. The semiconductor device of claim 1, wherein a gate stack is formed by the high-k dielectric layer, the silicon-rich semiconductor film, and the conductive layer, the gate stack having sidewalls; and further comprising:
   source/drain regions disposed in the substrate on opposing sides of the gate stack; and
   spacers disposed on the sidewalls of the gate stack.

5. The semiconductor device of claim 1, wherein the silicon-rich semiconductor film is free of dangling bonds.

6. The semiconductor device of claim 1, wherein a bonding structure of Si—Si—O—Si—O—Si($M_x$)—Si($M_x$) is formed downward from the silicon-rich film to the high-k dielectric layer, and wherein Si($M_x$) is silicate oxide.

7. The semiconductor device of claim 1, wherein a bonding structure of Si—Si—O—Si—O—Si($M_x$)-$M_x$ is formed downward from the silicon-rich film to the high-k dielectric layer, wherein Si($M_x$) is metal silicate oxide, and wherein the $M_x$ is metal oxide high-k dielectric.

8. The semiconductor device of claim 1, wherein a bonding structure of Si—Si—N—Si—O(N)—Si($M_x$)—Si($M_x$) is formed downward from the silicon-rich film to the high-k dielectric layer, and wherein Si($M_x$) is silicate oxide and O(N) is oxynitride.

9. The semiconductor device of claim 1, wherein a bonding structure of Si—Si—N—Si—O(N)—Si($M_x$)-M is formed downward from the silicon-rich film to the high-k dielectric layer, wherein Si($M_x$) is metal silicate oxide, and wherein the M is metal oxide, and wherein O(N) is oxynitride.

10. A semiconductor device, comprising:
    a substrate;
    an oxide layer formed on the substrate;
    a layer of high-k dielectric material formed over the oxide layer;
    a semiconductor film formed over the layer of high-k dielectric material, the semiconductor film comprising mostly silicon, the semiconductor film containing impurities, at least a portion of the impurities being bonded to the high-k dielectric material; and
    a layer of conductive material formed over the semiconductor film.

11. The semiconductor device of claim 10, wherein the impurities include one of oxygen and nitrogen.

12. The semiconductor device of claim 10, wherein the layer of high-k dielectric, the semiconductor film, and the layer of conductive material collectively form a gate structure; and further including source/drain regions formed in the substrate on either side of the gate structure.

13. The semiconductor device of claim 10, wherein the high-k dielectric material comprises a silicate.

14. The semiconductor device of claim 10, wherein the high-k dielectric material comprises a metal.

15. The semiconductor device of claim 10, wherein the semiconductor film is substantially free of dangling bonds.

16. A transistor, comprising:
    a substrate having isolation regions formed therein;
    an oxide layer located on the substrate;
    a layer of high-k material located over the oxide layer, the high-k material having a plurality of dangling bonds;
    a film located over the layer of high-k material, the film being a semiconductor material and comprising mostly silicon, wherein a portion of the dangling bonds are bonded to the film;
    a gate electrode layer located over the treated film, wherein a gate stack is formed by the layer of high-k material, the film, and the gate electrode layer;
    source/drain regions located in the substrate on opposing sides of the gate stack; and
    forming spacers on the sidewalls of the gate stack.

17. The transistor of claim 16, wherein the film is oxidized.

18. The transistor of claim 16, wherein the film is nitrided.

19. The transistor of claim 16, wherein the high-k dielectric material comprises a silicate.

20. The transistor of claim 16, wherein the dangling bonds are located at an interface between the layer of high-k dielectric material and the film, and wherein at least a portion of the dangling bonds are bonded to the semiconductor film.

* * * * *